United States Patent [19]

Gaebel

[11] Patent Number: 4,857,762
[45] Date of Patent: Aug. 15, 1989

[54] DIGITAL 2-OF-3 SELECTION AND OUTPUT CIRCUIT

[75] Inventor: Lutz Gaebel, Denkte, Fed. Rep. of Germany

[73] Assignee: Siemens Aktiengesellschaft, Berlin and Munich, Fed. Rep. of Germany

[21] Appl. No.: 113,478

[22] Filed: Oct. 28, 1987

[30] Foreign Application Priority Data

Nov. 3, 1986 [DE] Fed. Rep. of Germany ....... 3637238

[51] Int. Cl.⁴ .................. H03K 19/003; H03K 19/20; G02B 27/00
[52] U.S. Cl. .................................. 307/441; 307/445; 250/551
[58] Field of Search .............. 307/441, 445, 311; 340/825.29, 825.37, 825.38, 825.66, 825.82; 250/551

[56] References Cited

U.S. PATENT DOCUMENTS

| | | | |
|---|---|---|---|
| 3,305,735 | 2/1967 | Moreinses | 307/441 |
| 3,544,778 | 12/1970 | Masters | 307/441 |
| 3,895,241 | 7/1975 | Cooper | 307/311 |
| 3,999,087 | 12/1976 | Compton | 307/311 |
| 4,176,401 | 11/1979 | Lonberger | 307/311 |
| 4,321,487 | 3/1982 | Huykman | 307/311 |
| 4,639,727 | 1/1987 | Blasius et al. | 340/825.82 X |

FOREIGN PATENT DOCUMENTS

| | | | |
|---|---|---|---|
| 0053701 | 4/1980 | Japan | 250/551 |
| 1048478 | 10/1983 | U.S.S.R. | 307/441 |
| 2128007 | 4/1984 | United Kingdom . | |

OTHER PUBLICATIONS

Keiner, "An Opto-Coupler for Very Small Signals, Which Maintains DC Insulation", *Elecktronik*, vol. 25, No. 9, pp. 70-71, Sep. 1976.
AEG-Telefunken-Fachbuch 1970, pp. 208-209.

*Primary Examiner*—Stanley D. Miller
*Assistant Examiner*—Huy Kim Mai
*Attorney, Agent, or Firm*—Hill, Van Santen, Steadman & Simpson

[57] ABSTRACT

For the operation of a technical system having increased safety requirements, all of the apparatus for increasing the safety and the availbility are provided in triple redundancy. As selection and output circuit, three redundant data channels (DE1, DE2, DE3) normally emitting the same information are respectively connected in pairs to three AND elements, each consisting of two optocouplers (OR1/OR4, OR2/OR5, OR3/OR6). The elements of the optocouplers are connected with a relay (RL) by an OR arrangement (WO).

2 Claims, 1 Drawing Sheet

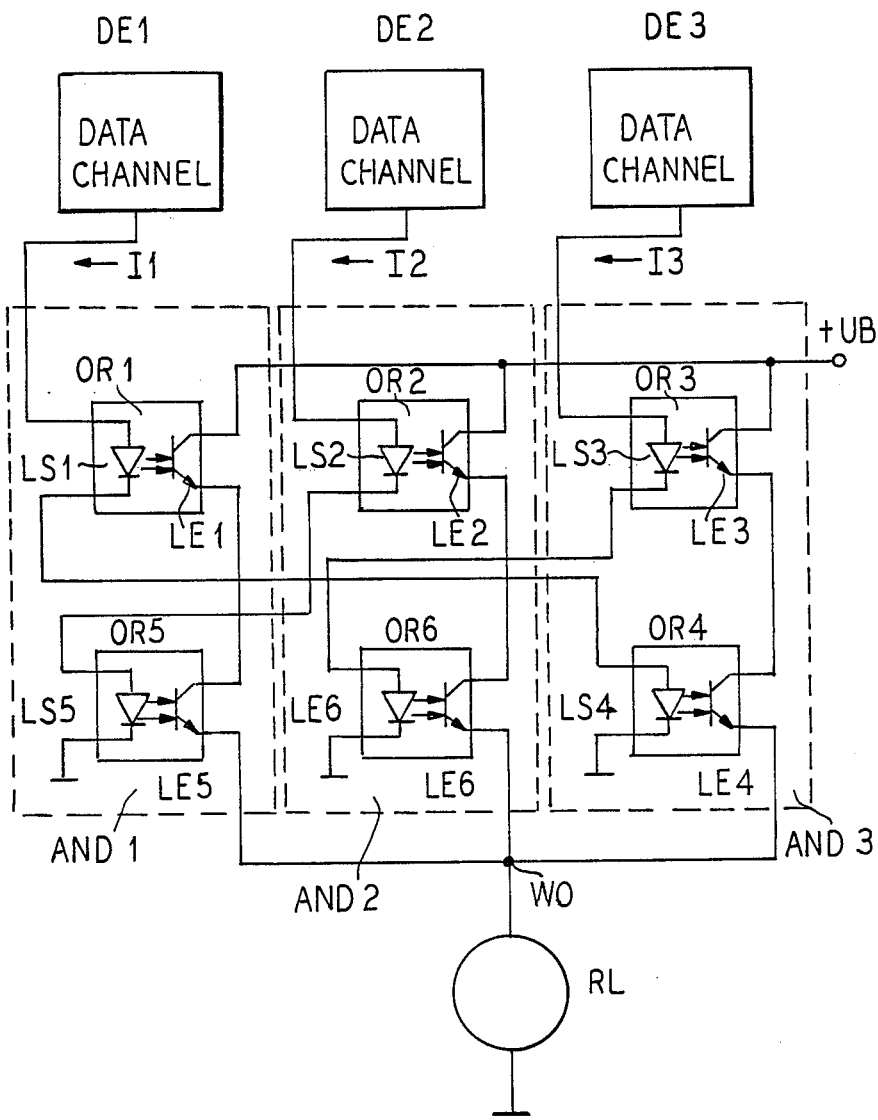

DIGITAL 2-OF-3 SELECTION AND OUTPUT CIRCUIT

BACKGROUND OF THE INVENTION

The invention is directed to a digital 2-of-3 selection and output circuit wherein three separate data channels are supplied in couples to logic gates in cyclic permutation. These logic gates are followed by an OR gate as an output element.

The OR gate outputs the logical result of at least two of three data channels or, respectively, data processing systems. A signal at level "1" thus always arises at the output of the OR gate when at least two of the three data channels supply a signal at level "1". One data channel can thus be down and thus offer a result deviating from the remaining two other data channels without blocking the output of the signal at level "1". When, by contrast, at least two data channels carry a signal at level "0", then the output of the OR gate also carries a signal at level "0". Such selection or, respectively, output circuits are known and described, for example, in Edgar Dombrowski, "Einfuhrung in die Zuverlassigkeit elektronischer Gerate und Systeme, AEG-Telefunken-Fachbuch 1970," pages 208/209, or by Masters U.S. Pat. No. 3,544,778. These known circuits are generally employed in safety switching units, for example in railroad signal technology. Critical parts of data processing and control systems are thereby tripled in accord with the high safety requirements, and also in view of greater availability. The same information is processed in all three of the data channels formed in this way. The digital 2-of-3 selection and output circuit serves the purpose of combining the 3 data channels.

SUMMARY OF THE INVENTION

The invention is based on the object of fashioning the known, digital 2-of-3 selection and output circuits in such a way that no undesired reactions occur with the other participating logic elements, despite the logic operations to be undertaken.

This object is achieved three AND elements, each consisting of two optocouplers, each including a light transmitter and a light receiver. In each of the AND elements, two light transmitters of two optocouplers are connected in series to one of the data channels, and with the light receivers of each of two optocouplers, which are allocated to different data channels at the transmission side, are connected in form to form series, with all of these series circuits being supplied as inputs to an OR gate.

The particular advantage of this design is, among other things, the low cost and complexity, because it allows costly repeaters to be eliminated.

A preferred, advantageous embodiment of the invention provides that the three series circuits formed of light receivers are connected in a "wired OR" arrangement OR gate includes and an output relay having its control input connected to the output of the "wired OR" arrangement.

SUMMARY OF THE DRAWING

An exemplary embodiment of the invention is shown in the drawing and shall be set forth in greater detail below. The drawing shows a schematic circuit diagram, partly in block diagram form, of an illustrative embodiment of the invention.

DESCRIPTION OF THE PREFERRED EMBODIMENT

The drawing shows specific details of a digital 2-of-3 selection and output circuit for information which, for safety reasons, is made available via three data channels DE1, DE2 and DE3 as information signals I1, I1 and I2. Six optocouplers OR1, OR2 through OR6, each having a light transmitter and light receiver, are utilized. The respective light transmitters of two opto couplers, for example the light transmitters LS1 and LS4 of the optocouplers OR1 and OR4, are connected in series and are connected to receive a signal at level "1" or "0" from the output of the data channel DE1. The analogous case applies to the light transmitters LS2 and LS5 and, respectively, LS3 and LS6 of the optocouplers OR2 and OR5 and, respectively, OR3 and OR6 for the output of the data channels DE2 and DE3. In this way, the three pairs of optocouplers form three AND gates AND1, AND2, AND3, each with parts a and b, respectively, as shown.

For the formation of a first 2-of-3 function, the light receiver LE1 of the optocoupler OR1 allocated to the data channel DE1 is connected in series with the light receiver LE5 of the optocoupler OR5 allocated to the other data channel DE2. The series circuit (which executes an AND operation) formed in this way is supplied with energy from a voltage source UB, and may control an output relay RL. This is always connected when the information I1 and I2 emitted via the data channels DE1 and DE2 are both equal to a signal at level "1".

In order to be able to optionally identify whether the two data channels DE2 and DE3 or, respectively, the data channels DE1 and DE3 have a "1" signal at their outputs, further series circuits are formed of the light receivers LE2 and LE6 and of the light receivers LE3 and LE4. All three AND elements formed of light receivers are combined in the circuit point WO by a "wired OR" connection, so that the output relay RL is always connected when at least two of the three data channels DE1, DE2 and DE3 carry the "1" signal at the output side.

Instead of the output relay RL, an arbitrary, other electrical output device can be employed, such as, for example one of the signal lamps standard in railway signaling technique.

It will be apparent that various modifications and/or additions may be made in the apparatus of the invention without departing from the essential feature of novelty involved, which are intended to be defined and secured by the appended claims.

I claim:

1. A digital 2-of-3 selection and output circuit comprising, in combination:
    three AND elements (AND1, AND2, AND3,) each consisting of parts of two optocouplers (OR1/OR5, OR2/OR6, OR3/OR4), each optocoupler (OR1) comprising a light transmitter (LS1) and a light receiver (LE1),
    two light transmitters (LS1/LS4, LS2/LS5, LS3/LS6) of two optocouplers (OR1/OR4, OR2/OR5, OR3/OR6) of different AND elements (AND1/AND3, AND2/AND1, AND3/AND2) are connected in series to one of three data channels (DE1, DE2, DE3), to be fed with an electrical signal at level "1" and the light receivers (LE1/LE5, LE2/LE6, LE3/LE4) of first said two optocouplers (OR1/OR5, OR2/OR6), OR3/OR5)

allocated with their light transmitters (LS1/LS5, LS2/LS6, LS3/LS4) to different data channels (DE1/DE2, DE2/DE3, DE3/DE1) being connected in series to form the output of the AND element, and an OR arrangement having three inputs connected to the outputs of said three AND elements.

2. A digital 2-of-3 selection and output circuit according to claim 1, wherein said three series circuits formed of light receivers (LE1/LE5, LE2/LE6, LE3/LE4) are connected in a "wired OR" (WO) circuit, and including an output relay (RL), the control input of said relay (RL) being connected to said "wired OR" circuit.

* * * * *